United States Patent
Liu et al.

(10) Patent No.: US 12,094,516 B2
(45) Date of Patent: Sep. 17, 2024

(54) METHOD AND APPARATUS FOR INTENSIFYING CURRENT LEAKAGE BETWEEN ADJACENT MEMORY CELLS, AND METHOD AND APPARATUS FOR CURRENT LEAKAGE DETECTION

(71) Applicant: CHANGXIN MEMORY TECHNOLOGIES, INC., Hefei (CN)

(72) Inventors: Huanhuan Liu, Hefei (CN); Wei-Chou Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 168 days.

(21) Appl. No.: 17/809,551

(22) Filed: Jun. 28, 2022

(65) Prior Publication Data
US 2023/0267987 A1    Aug. 24, 2023

Related U.S. Application Data

(63) Continuation of application No. PCT/CN2022/079034, filed on Mar. 3, 2022.

(30) Foreign Application Priority Data

Feb. 24, 2022    (CN) .......................... 202210172926.3

(51) Int. Cl.
| | |
|---|---|
| G11C 8/00 | (2006.01) |
| G11C 11/406 | (2006.01) |
| G11C 11/4074 | (2006.01) |
| G11C 11/4096 | (2006.01) |

(52) U.S. Cl.
CPC ........ *G11C 11/4074* (2013.01); *G11C 11/406* (2013.01); *G11C 11/4096* (2013.01)

(58) Field of Classification Search
USPC ......................................................... 365/201
See application file for complete search history.

(56) References Cited

U.S. PATENT DOCUMENTS

| | | | |
|---|---|---|---|
| 5,034,923 A | 7/1991 | Kuo | |
| 5,424,990 A * | 6/1995 | Ohsawa ................. | G11C 29/50 365/207 |
| 5,428,574 A | 6/1995 | Kuo | |
| 5,745,420 A * | 4/1998 | McClure .................. | G11C 7/18 365/69 |

(Continued)

FOREIGN PATENT DOCUMENTS

| | | |
|---|---|---|
| CN | 100421184 C | 9/2008 |
| CN | 102426858 A | 4/2012 |

(Continued)

*Primary Examiner* — Viet Q Nguyen
(74) *Attorney, Agent, or Firm* — Syncoda LLC; Feng Ma

(57) ABSTRACT

A method and apparatus for intensifying current leakage between adjacent memory cells includes that: a write operation is performed on a memory array, to form a column strip test pattern, the column strip test pattern being formed by arranging low-level memory cells and high-level memory cells in columns, and N columns of high-level memory cells being present between two adjacent columns of low-level memory cells, N≥2; and voltage adjustment is performed on the low-level memory cells and the high-level memory cells, to increase potential differences between the low-level memory cells and the high-level memory cells.

20 Claims, 10 Drawing Sheets

---

A write operation is performed on a memory array, to form a column strip test pattern, the column strip test pattern being formed by arranging low-level memory cells and high-level memory cells in columns, and N columns of high-level storage cells being present between two adjacent columns of low-level storage cells, N≥2    — 110

↓

Voltage adjustment is performed on the low-level memory cells and the high-level memory cells, to increase potential differences between the low-level memory cells and the high-level memory cells    — 120

(56) References Cited

U.S. PATENT DOCUMENTS

| | | | |
|---|---|---|---|
| 6,362,999 B2 * | 3/2002 | Akita | G11C 11/4087 |
| | | | 365/69 |
| 6,459,634 B1 * | 10/2002 | Sher | G11C 29/24 |
| | | | 365/201 |
| 6,560,163 B2 * | 5/2003 | Akita | H10B 12/50 |
| | | | 365/230.06 |
| 6,617,180 B1 * | 9/2003 | Wang | H10B 12/033 |
| | | | 438/18 |
| 8,274,853 B2 * | 9/2012 | Lee | G11C 29/12005 |
| | | | 365/201 |
| 8,693,271 B2 * | 4/2014 | Raval | G11C 29/06 |
| | | | 365/201 |
| 9,520,177 B2 * | 12/2016 | Matsumoto | G11C 11/4097 |
| 9,627,091 B1 * | 4/2017 | Chan | G11C 29/12005 |
| 10,008,276 B2 * | 6/2018 | Huynh | G11C 29/028 |
| 10,726,906 B2 * | 7/2020 | Seo | G11C 11/4094 |
| 10,811,109 B2 | 10/2020 | Baraskar | |
| 11,862,242 B2 * | 1/2024 | Yudanov | G11C 13/0026 |
| 2003/0012067 A1 | 1/2003 | Wong | |
| 2012/0263002 A1 | 10/2012 | Huang | |
| 2020/0145599 A1 | 5/2020 | Matsuzaki et al. | |

FOREIGN PATENT DOCUMENTS

| | | | | |
|---|---|---|---|---|
| CN | 103117094 A | | 5/2013 | |
| CN | 104425036 A | | 3/2015 | |
| CN | 104681102 A | | 6/2015 | |
| CN | 106601287 A | | 4/2017 | |
| CN | 104425036 B | | 10/2018 | |
| CN | 110637415 A | | 12/2019 | |
| CN | 111630599 A | | 9/2020 | |
| CN | 113077836 A | | 7/2021 | |
| JP | H02235300 A | | 9/1990 | |
| JP | 2007134001 A | * | 5/2007 | |
| JP | 4141656 B2 | * | 8/2008 | G11C 29/14 |
| JP | 4927164 B2 | * | 5/2012 | G01R 31/3004 |

* cited by examiner

|       | WL0 | WL1 | WL2 | WL3 | WL4 | WL5 | ⋯⋯ |   | WLmax |
|-------|-----|-----|-----|-----|-----|-----|-----|---|-------|
| BL0   | 0   | 1   | 1   | 1   | 0   | 1   |     |   |       |
| BL1   | 0   | 1   | 1   | 1   | 0   | 1   |     |   |       |
| BL2   | 0   | 1   | 1   | 1   | 0   | 1   |     |   |       |
| BL3   | 0   | 1   | 1   | 1   | 0   | 1   |     |   |       |
| BL4   | 0   | 1   | 1   | 1   | 0   | 1   |     |   |       |
| BL5   | 0   | 1   | 1   | 1   | 0   | 1   |     |   |       |
| BL6   | 0   | 1   | 1   | 1   | 0   | 1   |     |   |       |
| BL7   | 0   | 1   | 1   | 1   | 0   | 1   |     |   |       |
| ⋯⋯   |     |     |     |     |     |     |     |   |       |
| BLmax | 0   | 1   | 1   | 1   | 0   | 1   |     |   |       |

FIG. 2

METHOD AND APPARATUS FOR INTENSIFYING CURRENT LEAKAGE BETWEEN ADJACENT MEMORY CELLS, AND METHOD AND APPARATUS FOR CURRENT LEAKAGE DETECTION

CROSS-REFERENCE TO RELATED APPLICATION

This is a continuation application of International Patent Application No. PCT/CN2022/079034 filed on Mar. 3, 2022, which claims priority to Chinese Patent Application No. 202210172926.3 filed on Feb. 24, 2022. The disclosures of these applications are hereby incorporated by reference in their entirety.

BACKGROUND

A dynamic random access memory (DRAM) is a semiconductor memory device commonly used in computers, and includes many repeated memory cells. Each memory cell usually includes a capacitor and a transistor. A gate of the transistor is connected to a word line (WL), a drain of the transistor is connected to a bit line (BL), and a source of the transistor is connected to the capacitor. A voltage signal on the word line can be used to control turning on or turning off of the transistor, and further, data information stored in the capacitor is read through the bit line, or data information is written into the capacitor through the bit line for storage.

As the process technology of the DRAM becomes more and more advanced and the memory density becomes higher and higher, there are more and more problems in the process technology of the DRAM, for example, a short circuit caused by drop of by-products, current leakage of the bit line, capacitor collapse, metal wire breakage, and a structural problem caused by unqualified key dimensions. The problems appeared in the process technology need to be screened out during yield testing.

How to accurately detect memory cells with a potential current leakage defect during yield testing is an urgent problem to be solved by those skilled in the art.

SUMMARY

The present disclosure relates to the field of semiconductor technologies, and the embodiments of the present disclosure provide a method and apparatus for intensifying current leakage between adjacent memory cells, and a method and apparatus for current leakage detection.

In a first aspect, an embodiment of the present disclosure provides a method for intensifying current leakage between adjacent memory cells. The method includes the following operations.

A write operation is performed on a memory array, to form a column strip test pattern. Herein, the column strip test pattern is formed by arranging low-level memory cells and high-level memory cells in columns, and N columns of high-level memory cells are present between two adjacent columns of low-level memory cells, N≥2.

Voltage adjustment is performed on the low-level memory cells and the high-level memory cells, to increase potential differences between the low-level memory cells and the high-level memory cells.

In a second aspect, an embodiment of the present disclosure provides a method for current leakage detection based on the method according to the first aspect. The method for current leakage detection includes the following operations.

A read operation is performed on the low-level memory cells to read data.

Current leakage detection results of the low-level memory cells are obtained based on the data.

In a third aspect, an embodiment of the present disclosure provides an apparatus for intensifying current leakage between adjacent memory cells. The apparatus includes a writing circuit and a voltage adjustment circuit.

The writing circuit is configured to perform a write operation on a memory array, to form a column strip test pattern. Herein, the column strip test pattern is formed by arranging low-level memory cells and high-level memory cells in columns, and N columns of high-level memory cells are present between two adjacent columns of low-level memory cells, N≥2.

The voltage adjustment circuit is configured to perform voltage adjustment on the low-level memory cells and the high-level memory cells, to increase potential differences between the low-level memory cells and the high-level memory cells.

In a fourth aspect, an embodiment of the present disclosure provides an apparatus for current leakage detection including the apparatus according to the third aspect. The apparatus for current leakage detection includes a reading circuit and a processing circuit.

The reading circuit is configured to perform a read operation on the low-level memory cells to read data.

The processing circuit is configured to obtain current leakage detection results of the low-level memory cells based on the data.

In a fifth aspect, an embodiment of the present disclosure provides a semiconductor memory, including the apparatus according to the fourth aspect.

BRIEF DESCRIPTION OF THE DRAWINGS

In the accompanying drawings, unless otherwise specified, the same reference numerals in a plurality of drawings represent the same or similar components or elements. These accompanying drawings may not be drawn to scale. It should be noted that these accompanying drawings only depict some implementations of the present disclosure, and should not be regarded as limitations to the scope of the present disclosure.

FIG. 2 is a schematic diagram of forming a column strip test pattern according to an embodiment of the present disclosure.

DETAILED DESCRIPTION

Figure 1:
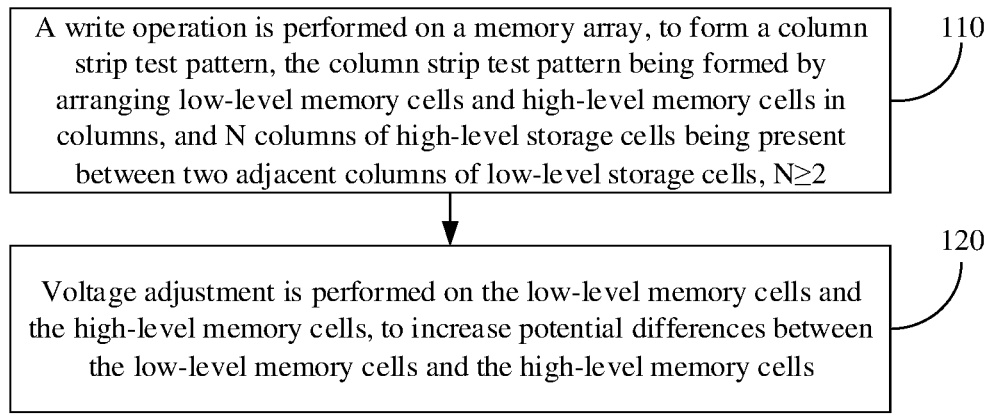
FIG. 1 is a schematic flowchart of implementation of a method for intensifying current leakage between adjacent memory cells according to an embodiment of the present disclosure.

The exemplary implementations of the present disclosure will be described in more detail below with reference to the accompanying drawings. Although the accompanying drawings show the exemplary implementations of the present disclosure, it should be understood that the present disclosure may be implemented in various manners and should not be limited by the specific implementations described herein. On the contrary, these implementations are provided for the thorough understanding of the present disclosure, and comprehensively convey the scope of the present disclosure to those skilled in the art.

In the following description, many specific details are provided to facilitate more thorough understanding of the present disclosure. However, it is obvious to those skilled in the art that the present disclosure can be implemented without one or more of these details. In other examples, to avoid confusion with the present disclosure, some technical features known in the art are not described. In other words, herein, not all features of actual embodiments are described, and known functions and structures are not described in detail.

In the accompanying drawings, for clarity, the dimensions and relative dimensions of layers, regions and elements may be exaggerated. The same reference numerals denote the same elements throughout the present disclosure.

It should be understood that terms indicating the spatial relationships such as "under", "below", "lower", "beneath", "above", and "upper" are used herein for the convenience of description, so as to describe the relationships between one element or feature and other elements or features shown in the figures. It should be understood that in addition to the orientations shown in the figures, the terms indicating the spatial relationships are also intended to include different orientations of a device in use and operation. For example, if the device in the figures is upside down, then an element or feature described as being "under", "beneath", or "below" other elements or features will be oriented to be "above" the other elements or features. Therefore, the exemplary terms "under" and "below" may include both an upper orientation and a lower orientation. The device can be otherwise oriented (rotated by 90 degree or other orientations) and the spatial descriptions used here are interpreted accordingly.

The terms are used herein to merely for purpose of describing specific embodiments and not as a limitation of the present disclosure. As used herein, singular forms "a", "an", and "the/said" are intended to also include plural forms, unless specified in the contexts to the contrary. It should also be understood that the terms "consisting of" and/or "including", when used in this specification, confirm the existence of the described features, integers, steps, operations, elements and/or components, but do not exclude the existence or addition of one or more other features, integers, steps, operations, elements, components and/or groups. A term "and/or" used herein includes any one or any combination of one or more related listed items.

With the development of the semiconductor memory technologies, the manufacturing process of memories is becoming more and more mature, and the semiconductor memory is also developing in the direction of smaller scale and greater integration. During manufacturing of the semiconductor, due to high requirements for the manufacturing process and high precision of the manufacturing process, there may be a certain quantity of defective products. Some defects of the defective products are exposed obviously, which can be detected during detection and then be repaired or discarded. However, some defects of the defective products cannot be detected during detection, and will only be exposed after repeated erasing and writing. One of defects between adjacent memory cells is an obvious defect and can be quickly and accurately detected during detection. The other of defects between adjacent memory cells is a potential current leakage defect. The potential current leakage defect between adjacent memory cells refers to a current leakage defect formed between the adjacent memory cells due to the influence of factors such as process deviation, environment and devices in the manufacturing process of memories. At present, it is difficult to detect such a defect during detection of the memories, that is, it is difficult to accurately detect the memory cells with the potential current leakage defect during yield testing. Such a defect will only appear due to cyclic reading and writing in later use, and cause a data reading error, and the like.

Based on this, how to detect a potential current leakage defect between adjacent memory cells in time becomes an urgent problem to be solved.

In view of this, the following implementations of the present disclosure are provided. An embodiment of the present disclosure provides a method for intensifying current leakage between adjacent memory cells. FIG. 1 is a schematic flowchart of implementation of a method for intensifying current leakage between adjacent memory cells according to an embodiment of the present disclosure. As shown in FIG. 1, the method includes the following operations 110 to 120.

In operation 110, a write operation is performed on a memory array, to form a column strip test pattern, the column strip test pattern being formed by arranging low-level memory cells and high-level memory cells in columns, and N columns of high-level memory cells being present between two adjacent columns of low-level memory cells, N≥2.

In operation 120, voltage adjustment is performed on the low-level memory cells and the high-level memory cells, to increase potential differences between the low-level memory cells and the high-level memory cells.

It should be noted that in the embodiments of the present disclosure, an example that N=3 is used for description.

FIG. 2 is a schematic diagram of forming a column strip test pattern according to an embodiment of the present disclosure. As shown in FIG. 2, in the embodiments of the present disclosure, a write operation is performed on a memory array, to form a column strip test pattern. A specific process includes that: logic 0 is written into memory cells corresponding to WL0, and logic 1 is written into memory cells corresponding to WL1, WL2, and WL3; logic 0 is written into memory cells corresponding to WL4, and logic 1 is written into memory cells corresponding to WL5, WL6, and WL7; and the rest is deduced by analogy, until the write operation is performed on all the columns in the memory array. Herein, memory cells corresponding to WL0, WL4, WL8, . . . are low-level memory cells, and memory cells corresponding to WL1, WL2, WL3, WL5, WL6, WL7, . . .

are high-level memory cells. The low-level memory cells and the high-level memory cells are arranged in columns, and three columns of high-level memory cells are present between two adjacent columns of low-level memory cells.

In some embodiments, the test pattern is any combination of logic "1" or "0" written into respective memory cells of the memory array in one-to-one correspondence. For example, the test pattern (i.e., column strip test pattern) may be obtained by writing "1" or "0" into the memory cells of the memory array in columns, or the test pattern (i.e., row strip test pattern) may be obtained by writing "1" or "0" into the memory cells of the memory array in rows. For example, in some embodiments of the present disclosure, a write operation may be performed on a memory array, to form a row strip test pattern. A specific process includes that: logic 0 is written into BL0, and logic 1 is written into BL1, BL2, and BL3; logic 0 is written into BL4, and logic 1 is written into BL5, BL6, and BL7; and the rest is deduced by analogy, until the write operation is performed on all the rows in the memory array. Herein, memory cells corresponding to BL0, BL4, BL8, . . . are low-level memory cells, and memory cells corresponding to BL1, BL2, BL3, BL5, BL6, BL7, . . . are high-level memory cells. The low-level memory cells and the high-level memory cells are arranged in rows, and three rows of high-level memory cells are present between two adjacent rows of low-level memory cells.

In the embodiments of the present disclosure, a high-level voltage VARY corresponding to the high-level memory cells is connected to a high voltage VDD, to increase levels of the high-level memory cells. Herein, the high-level voltage VARY is a voltage signal when writing the logic "1". To be specific, in the embodiments of the present disclosure, the high-level voltage VARY is applied to WL1, WL2, WL3, WL5, WL6, WL7, . . . , to write the logic 1 into WL1, WL2, WL3, WL5, WL6, WL7, In the embodiments of the present disclosure, the high-level voltage VARY is connected to the high voltage VDD, to increase/raise the levels of the high-level memory cells, thereby intensifying potential differences between the low-level memory cells and the high-level memory cells.

In a specific implementation of the present disclosure, the high voltage VDD is 1.4 V.

In the embodiments of the present disclosure, multiple refresh operations are performed on the high-level memory cells. In the embodiments of the present disclosure, the low-level memory cells are taken as detection targets, and the multiple refresh operations are performed on the high-level memory cells, to intensify current leakage between the low-level memory cells and the high-level memory cells, so that memory cells with a potential current leakage defect can be detected.

In the embodiments of the present disclosure, plate voltages VPLT corresponding to the low-level memory cells and the high-level memory cells are adjusted by a first stride after each refresh operation, until the plate voltages VPLT decreases to a target voltage. Herein, the first stride may be 0.1, 0.15, or 0.2. In the embodiments of the present disclosure, the plate voltages VPLT are reduced stepwise, thereby avoiding potential abnormality of memory cells caused by excessive sudden change of the plate voltages VLPT.

In some embodiments, the plate voltages VPLT corresponding to the low-level memory cells and the high-level memory cells may be adjusted by a variable stride, until the plate voltages VPLT decreases to a target voltage. For example, a stride used in the first adjustment may be 0.1, and a stride used in the second adjustment may be 0.2.

In some embodiments, the plate voltages VPLT corresponding to the low-level memory cells and the high-level memory cells may be adjusted after the write operation is performed on the memory array, to reduce the plate voltages VPLT. For example, the plate voltages VPLT corresponding to the low-level memory cells and the high-level memory cells are adjusted from 0.5 V to 0.3 V after the write operation is performed on the memory array.

In a specific implementation of the present disclosure, the target voltage of the plate voltage VPLT may be 0.1 V. An initial voltage of the plate voltage VPLT may be 0.5 V.

In the embodiments of the present disclosure, voltage-decreasing adjustment may be performed on bit line pre-charge voltages VBLP. For example, the bit line pre-charge voltages VBLP are adjusted from 0.5 V to 0.45 V, so that a potential current leakage defect of a low-level memory cell can be detected easily.

Figure 3A:
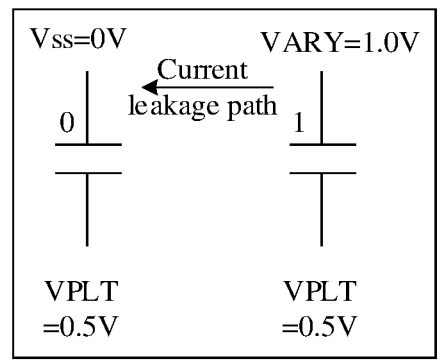
FIG. 3A is a first schematic diagram of current leakage between adjacent memory cells according to an embodiment of the present disclosure.
Figure 3B:
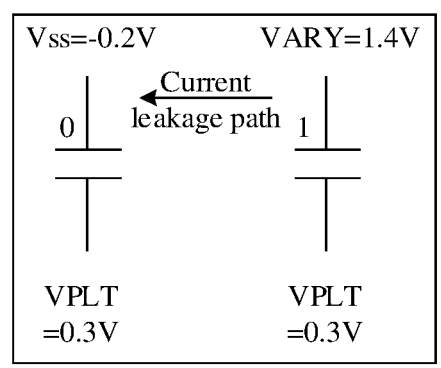
FIG. 3B is a second schematic diagram of current leakage between adjacent memory cells according to an embodiment of the present disclosure.

FIG. 3A is a first schematic diagram of current leakage between adjacent memory cells according to an embodiment of the present disclosure. FIG. 3B is a second schematic diagram of current leakage between adjacent memory cells according to an embodiment of the present disclosure. It should be noted that FIG. 3A shows a current leakage situation in which the method for intensifying current leakage between adjacent memory cells according to the present disclosure is not used to perform voltage adjustment on the memory cells, and FIG. 3B shows a current leakage situation in which the method for intensifying current leakage between adjacent memory cells according to the present disclosure is used to perform voltage adjustment on the memory cells. As shown in FIG. 3A, a low-level voltage Vss corresponding to the low-level memory cell is 0 V, a plate voltage VPLT corresponding to the low-level memory cell is 0.5 V; and the high-level voltage VARY corresponding to the high-level memory cell is 1 V, and a plate voltage VPLT corresponding to the high-level memory cell is 0.5 V. As shown in FIG. 3B, the plate voltages VPLT corresponding to the low-level memory cell and the high-level memory cell are adjusted to 0.3 V, so that the low-level voltage Vss corresponding to the low-level memory cell becomes −0.2 V accordingly, and the high-level voltage VARY corresponding to the high-level memory cell is adjusted to 1.4 V. In this way, compared with FIG. 3A, a potential difference between the low-level memory cell and the high-level memory cell is changed from 1 V to 1.6 V. Therefore, based on the method for intensifying current leakage between adjacent memory cells according to the present disclosure, current leakage between the low-level memory cells and the high-level memory cells may be intensified to a large extent, so that memory cells with a potential current leakage defect can be detected.

Figure 3C:
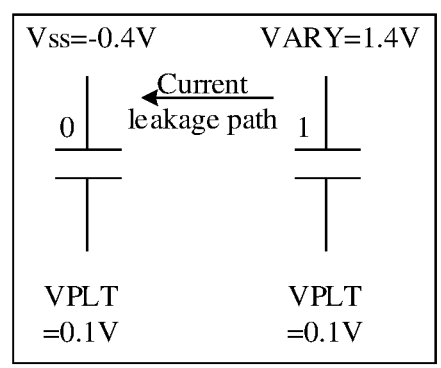
FIG. 3C is a third schematic diagram of current leakage between adjacent memory cells according to an embodiment of the present disclosure.

FIG. 3C is a third schematic diagram of current leakage between adjacent memory cells according to an embodiment of the present disclosure. As shown in FIG. 3C, on the basis of FIG. 3B, after a refresh operation is performed on the high-level memory cell, the plate voltages VPLT corresponding to the low-level memory cell and the high-level memory cell are further adjusted to 0.1 V, so that the low-level voltage Vss corresponding to the low-level memory cell becomes −0.4 V accordingly. In this way, compared with FIG. 3A, the potential difference between the low-level memory cell and the high-level memory cell is changed from 1 V to 1.8 V. Therefore, current leakage between the low-level memory cells and the high-level memory cells is further intensified, so that memory cells with a potential current leakage defect can be detected more easily and more quickly.

In the embodiments of the present disclosure, voltage-decreasing adjustment is performed on gate voltages VKK of the low-level memory cells and the high-level memory cells. For example, the gate voltages VKK are adjusted from −0.2 V to −0.5 V, to suppress current leakage in a normal situation.

Figure 4:
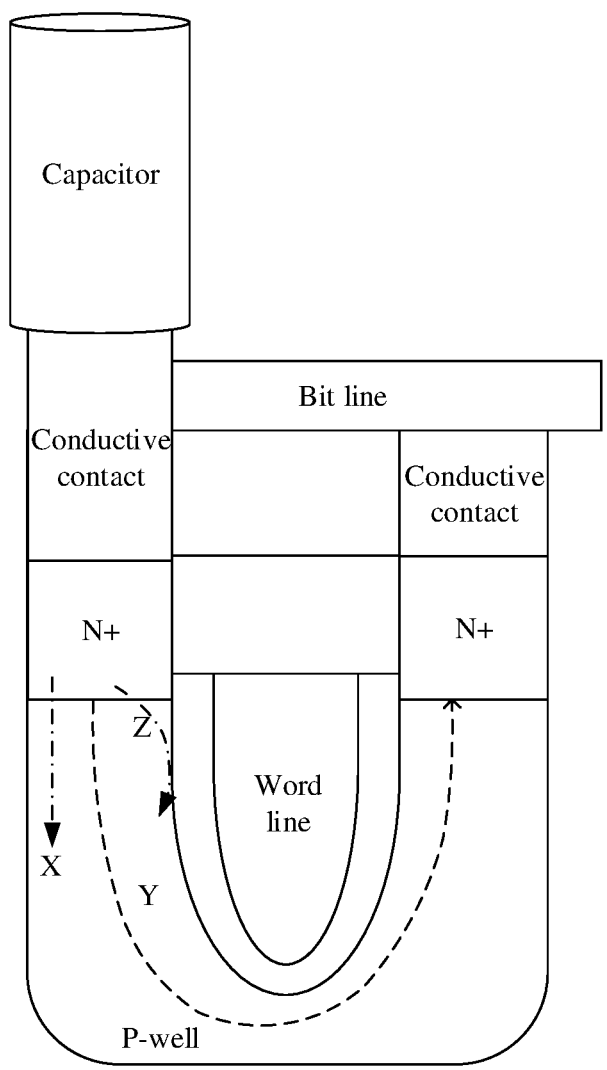
FIG. 4 is a schematic diagram of current leakage paths in a normal situation according to an embodiment of the present disclosure.

FIG. 4 is a schematic diagram of current leakage paths in a normal situation according to an embodiment of the present disclosure. As shown in FIG. 4, there are three current leakage conditions in the normal situation. The first one is a leakage current in the reverse bias of the PN junction, which corresponds to a current leakage path X. The second one is a leakage current in a cut-off state of a metal-oxide-semiconductor (MOS) transistor, which corresponds to a current leakage path Y. The third one is a leakage current caused by a strong potential difference between the memory cell and the word line, which corresponds to a current leakage path Z. Because current leakage detection in an abnormal situation may be affected by these current leakage conditions between adjacent memory cells in the normal situation, in the embodiments of the present disclosure, voltage-decreasing adjustment is performed on the gate voltages VKK to suppress the second one and the third one of the three current leakage conditions. Herein, the gate voltage VKK is a gate voltage in the cut-off state of the MOS transistor. Further, in the embodiments of the present disclosure, the low-level memory cells are taken as the detection targets, so that the reverse bias of the PN junction may be avoided, thereby avoiding occurrence of the first one of the three current leakage conditions. In this way, current leakage in the normal situation may be reduced to an extremely large extent, so that targeted detection of current leakage in the abnormal situation may be strengthened. In addition, a situation where a normal memory cell is detected to have a current leakage defect due to the current leakage in the normal situation may be further avoided.

Figure 5:
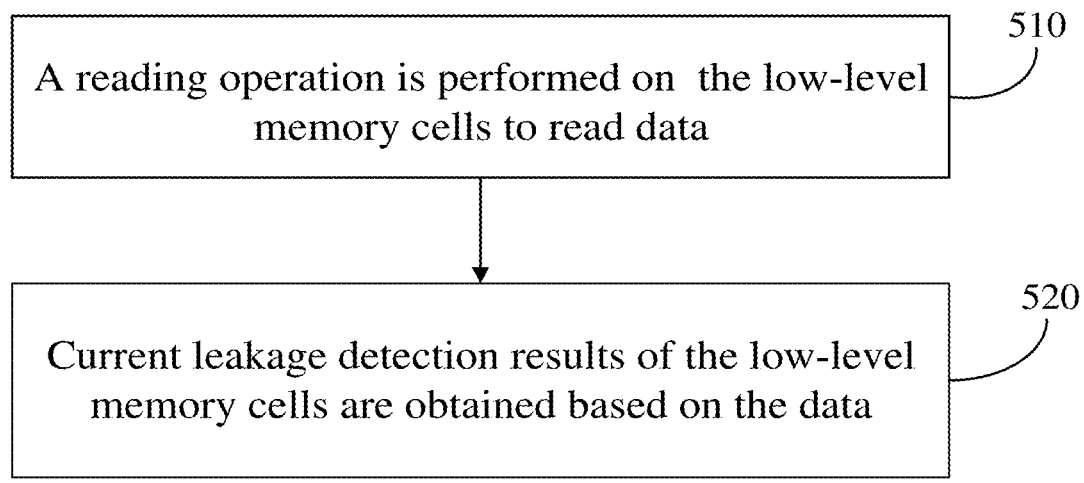
FIG. 5 is a schematic flowchart of implementation of a method for current leakage detection according to an embodiment of the present disclosure.

An embodiment of the present disclosure provides a method for current leakage detection based on the foregoing method for intensifying current leakage between adjacent memory cells, that is, the method for current leakage detection provided in the embodiments of the present disclosure is performed on the basis of the method for intensifying current leakage between adjacent memory cells. FIG. 5 is a schematic flowchart of implementation of a method for current leakage detection according to an embodiment of the present disclosure. As shown in FIG. 5, the method includes the following operations 510 to 520.

In operation 510, a read operation is performed on the low-level memory cells to read data.

In operation 520, current leakage detection results of the low-level memory cells are obtained based on the data.

In the embodiments of the present disclosure, after voltage adjustment is performed on the low-level memory cells and the high-level memory cells, a read operation is performed on the low-level memory cells in a low temperature environment to read data. Herein, the temperature of the low temperature environment ranges from −40° C. to −10° C. The three current leakage conditions in the normal situation shown in FIG. 4 may be effectively suppressed by performing current leakage detection in the low temperature environment, so that the targeted detection of the current leakage in the abnormal situation may be strengthened. In a specific example, a test temperature of Double Data Rate 4 (DDR4) may be −10° C., and a test temperature of Low Power Double Data Rate 4 (LPDDR4) may be −33° C.

In the embodiments of the present disclosure, the low-level memory cells are taken as the detection targets, and voltages corresponding to the low-level memory cells and the high-level memory cells are restored after the current leakage detection results of the low-level memory cells are obtained. It should be noted that the voltages corresponding to the low-level memory cells and the high-level memory cells are restored, which includes: the plate voltages VPLT corresponding to the low-level memory cells and the high-level memory cells, the high-level voltage VARY corresponding to the high-level memory cells, and the gate voltages VKK of the low-level memory cells and the high-level memory cells are restored to respective initial voltages.

Figure 6:
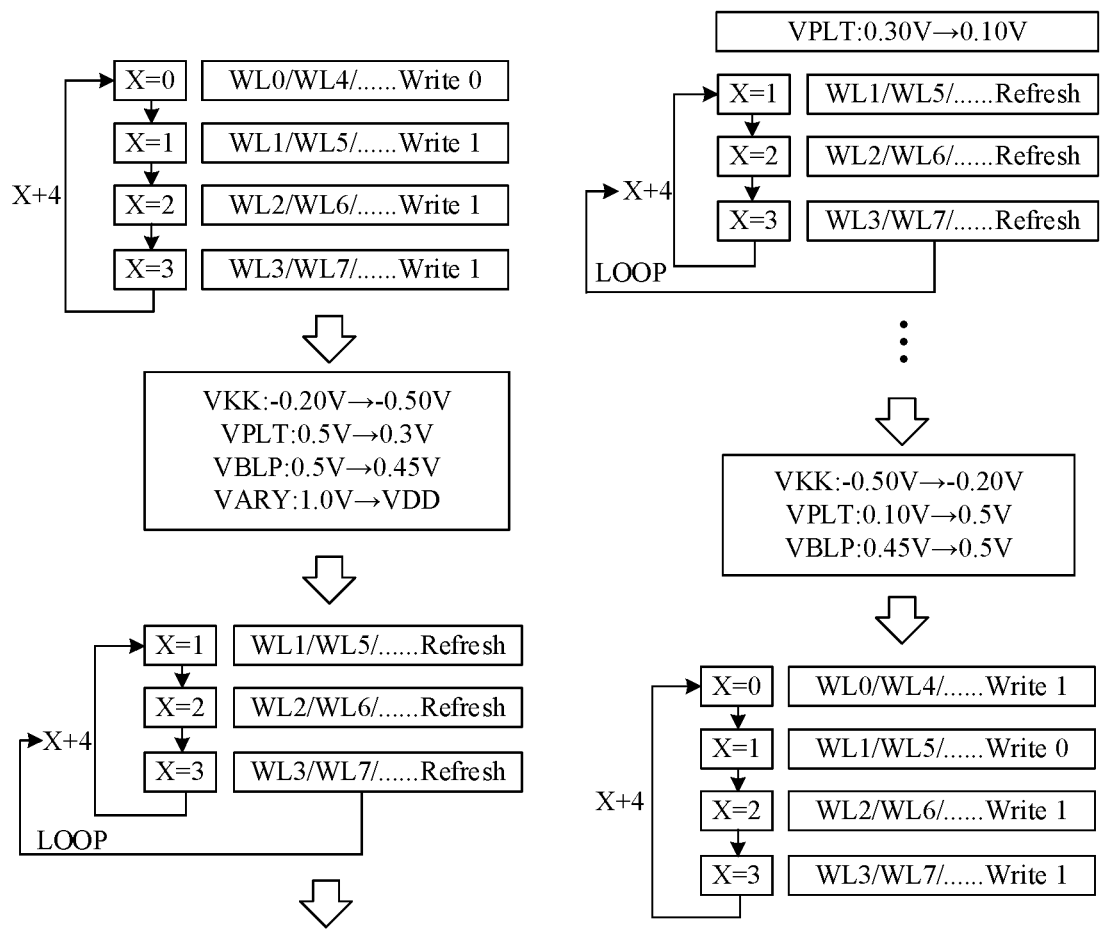
FIG. 6 is a schematic flowchart of implementation of a method for current leakage detection according to an exemplary embodiment of the present disclosure.

FIG. 6 is a schematic flowchart of implementation of a method for current leakage detection according to an exemplary embodiment of the present disclosure. It should be noted that in FIG. 6, an example in which N=3 is used for description. As shown in FIG. 6, a specific process of performing the write operation on the memory array, to form the column strip test pattern includes that: logic 0 is written into memory cells corresponding to WL0/WL4/ . . . , and logic 1 is written into memory cells corresponding to WL1/WL5/ . . . , WL2/WL6/ . . . , and WL3/WL7/ . . . . For WLs, WL0, WL1, WL2, and WL3 are in a repeated unit, and a quantity of WLs in the repeated unit is 4. Memory cells corresponding to WL0/WL4/ . . . are the low-level memory cells, and memory cells corresponding to WL1/WL5/ . . . , WL2/WL6/ . . . , and WL3/WL7/ . . . are the high-level memory cells.

As shown in FIG. 6, a specific process of performing voltage adjustment on the low-level memory cells and the high-level memory cells includes that: the gate voltages VKK of the low-level memory cells and the high-level memory cells are adjusted from −0.2 V to −0.5 V, the plate voltages VPLT corresponding to the low-level memory cells and the high-level memory cells are adjusted from 0.5 V to 0.3 V, the bit line pre-charge voltages VBLP are adjusted from 0.5 V to 0.45 V, and the high-level voltage VARY corresponding to the high-level memory cells is adjusted to the high voltage VDD.

As shown in FIG. 6, the first refresh operation is performed on the high-level memory cells corresponding to WL1/WL5/ . . . , WL2/WL6/ . . . , and WL3/WL7/ . . . .

As shown in FIG. 6, voltage-decreasing adjustment is performed on the plate voltages VPLT again by the first stride of 0.2 after the first refresh operation, until the plate voltages VPLT decreases to the target voltage 0.1 V. After this voltage-decreasing adjustment, the plate voltages VPLT has been adjusted to the target voltage 0.1 V. Therefore, voltage-decreasing adjustment does not need to be performed on the plate voltages VLPT again after the subsequent refresh operation.

As shown in FIG. 6, after the multiple refresh operations are performed on the high-level memory cells corresponding to WL1/WL5/ . . . , WL2/WL6/ . . . , and WL3/WL7/ . . . , the read operation is performed on the low-level memory cells corresponding to WL0/WL4/ . . . in the low temperature environment to read data from the low-level memory cells corresponding to WL0/WL4/ . . . , and obtain current leakage detection results of the low-level memory cells based on the data. In the embodiments of the present disclosure, the low-level memory cells are taken as the detection targets, and the multiple refresh operations are performed on the high-level memory cells, to intensify current leakage between the low-level memory cells and the high-level memory cells, so that memory cells with a potential current leakage defect can be detected.

As shown in FIG. 6, the low-level memory cells corresponding to WL0/WL4/ . . . are taken as the detection targets, and after the current leakage detection is performed, a specific process of restoring voltages corresponding to the low-level memory cells and the high-level memory cells includes that: the gate voltages VKK are restored from −0.5 V to −0.2 V, the plate voltages VPLT are restored from 0.1 V to 0.5 V, the bit line pre-charge voltages VBLP are restored from 0.45 V to 0.5 V, and the high-level voltage VARY corresponding to the high-level memory cells is restored from VDD to 1 V.

At this time, because the memory cells that have been detected (i.e., detected memory cells) do not encompass all the memory cells in the memory array, there is need to switch the detection targets to detect memory cells that are not detected (i.e., undetected memory cells). In this case, memory cells corresponding to WL1/WL5/ . . . may be taken as the detection targets, logic 0 is written into the memory cells corresponding to WL1/WL5/ . . . , and logic 1 is written into memory cells corresponding to WL0/WL4/ . . . , WL2/WL6/ . . . , and WL3/WL7/ . . . . Herein, the memory cells corresponding to WL1/WL5/ . . . are the low-level memory cells, and the memory cells corresponding to WL0/WL4/ . . . , WL2/WL6/ . . . , and WL3/WL7/ . . . are the high-level memory cells. Voltage adjustment is performed on the low-level memory cells and the high-level memory cells, to increase potential differences between the low-level memory cells and the high-level memory cells. Then, the read operation is performed on the low-level memory cells corresponding to WL1/WL5/ . . . , to read data from the low-level memory cells corresponding to WL1/WL5/ . . . ; and current leakage detection results of the low-level memory cells corresponding to WL1/WL5/ . . . is obtained based on the data.

After the current leakage detection is performed by taking the low-level memory cells corresponding to WL1/WL5/ . . . as the detection targets, memory cells corresponding to WL2/WL6/ . . . are taken as the detection targets for current leakage detection, logic 0 is written into the memory cells corresponding to WL2/WL6/ . . . , and logic 1 is written into memory cells corresponding to WL0/WL4/ . . . , WL1/WL5/ . . . , and WL3/WL7/ . . . . After detection of the memory cells corresponding to WL2/WL6/ . . . is completed, memory cells corresponding to WL3/WL7/ . . . are taken as the detection targets for current leakage detection, logic 0 is written into the memory cells corresponding to WL3/WL7/ . . . , and logic 1 is written into memory cells corresponding to WL0/WL4/ . . . , WL1/WL5/ . . . , and WL2/WL6/ . . . . In this way, the detected memory cells encompass all the memory cells in the memory array after four loops of current leakage detection. In other words, detection of the full memory array is achieved after four loops of current leakage detection.

It should be noted that in actual application, a quantity of WLs in the repeated unit may be adjusted according to actual detection requirements, so as to adjust a quantity of rounds of detection based on the quantity of WLs in the repeated unit, and further control detection time based on the quantity of rounds of detection.

Further, an embodiment of the present disclosure provides a method for current leakage detection, to enable, when current leakage detection is performed on low-level memory cells, memory cells with a potential current leakage defect to be detected more easily and more quickly. Therefore, in the technical solutions of the present disclosure, the problem that potential defects between adjacent memory cells are presented due to cyclic reading and writing of the these memory cells during use of the memory and cause a data reading error is reduced to a certain extent, thereby ensuring the quality of the memory.

Figure 7:
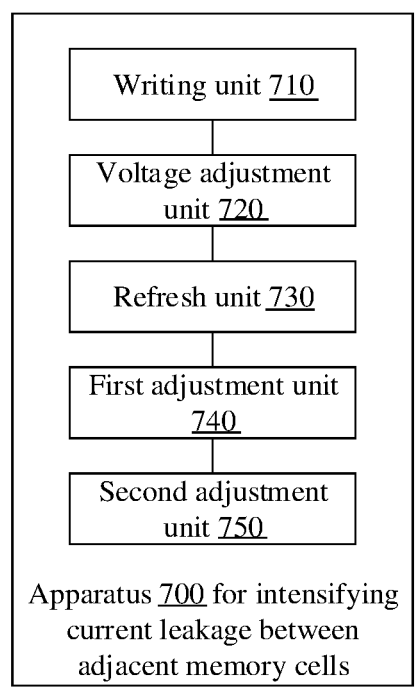
FIG. 7 is a schematic structural diagram of an apparatus for intensifying current leakage between adjacent memory cells according to an embodiment of the present disclosure.

Based on the same technical concept as the foregoing method for intensifying current leakage between adjacent memory cells, an embodiment of the present disclosure provides an apparatus for intensifying current leakage between adjacent memory cells. FIG. 7 is a schematic structural diagram of an apparatus for intensifying current leakage between adjacent memory cells according to an embodiment of the present disclosure. As shown in FIG. 7, the apparatus 700 for intensifying current leakage between adjacent memory cells includes a writing unit 710 and a voltage adjustment unit 720.

The writing unit 710 is configured to perform a write operation on a memory array, to form a column strip test pattern, the column strip test pattern being formed by arranging low-level memory cells and high-level memory cells in columns, and N columns of high-level memory cells are present between two adjacent columns of low-level memory cells, N≥2.

The voltage adjustment unit 720 is configured to perform voltage adjustment on the low-level memory cells and the high-level memory cells, to increase potential differences between the low-level memory cells and the high-level memory cells.

In some embodiments, the voltage adjustment unit 720 is configured to connect a high-level voltage VARY corresponding to the high-level memory cells to a high voltage VDD, to increase levels of the high-level memory cells.

In some embodiments, the apparatus further includes a refresh unit 730, configured to perform multiple refresh operations on the high-level memory cells.

In some embodiments, the voltage adjustment unit 720 is further configured to adjust plate voltages VPLT corresponding to the low-level memory cells and the high-level memory cells by a first stride after each refresh operation, until the plate voltages VPLT decreases to a target voltage.

In some embodiments, the apparatus further includes a first adjustment unit 740, configured to perform voltage-decreasing adjustment on gate voltages VKK of the low-level memory cells and the high-level memory cells.

In some embodiments, the apparatus further includes a second adjustment unit 750, configured to perform voltage-decreasing adjustment on bit line pre-charge voltages VBLP of the low-level memory cells and the high-level memory cells.

In some embodiments, each low-level memory cell is a memory cell to which logic 0 is written; and each high-level memory cell is a memory cell to which logic 1 is written.

Figure 8:
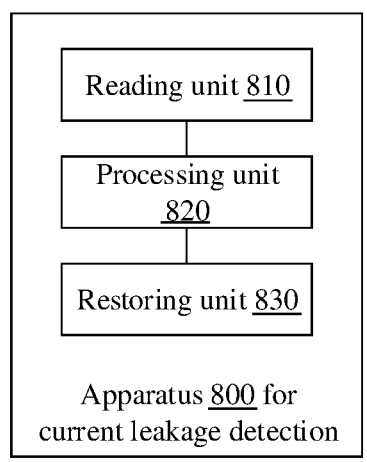
FIG. 8 is a schematic structural diagram of an apparatus for current leakage detection according to an embodiment of the present disclosure.

Based on the same technical concept as the foregoing method for current leakage detection, an embodiment of the present disclosure provides an apparatus for current leakage detection. FIG. 8 is a schematic structural diagram of an apparatus for current leakage detection according to an embodiment of the present disclosure. As shown in FIG. 8, the apparatus 800 for current leakage detection includes a reading unit 810 and a processing unit 820.

The reading unit 810 is configured to perform a read operation on the low-level memory cells in a low temperature environment to read data from the low-level memory cells.

The processing unit 820 is configured to obtain current leakage detection results of the low-level memory cells based on the data.

In some embodiments, the apparatus further includes a restoring unit 830, configured to restore voltages corresponding to the low-level memory cells and the high-level memory cells after the current leakage detection results of the low-level memory cells are obtained.

An embodiment of the present disclosure further provides a semiconductor memory, including the foregoing apparatus for intensifying current leakage between adjacent memory cells and the foregoing apparatus for current leakage detection. The semiconductor memory provided in the present disclosure includes, but is not limited to, a DRAM. The semiconductor memory may use the apparatus for intensifying current leakage between adjacent memory cells in the present disclosure to increase potential differences between the low-level memory cells and the high-level memory cells, so as to intensify a potential current leakage defect between adjacent memory cells. Thus, the potential current leakage defect between adjacent memory cells can be detected when current leakage detection is performed by the apparatus for current leakage detection in the present disclosure.

In some embodiments, the semiconductor memory is a DRAM chip, and the memory about the DRAM chip conforms to the DDR2 memory specification.

In some embodiments, the semiconductor memory is a DRAM chip, and the memory about the DRAM chip conforms to the DDR3 memory specification.

In some embodiments, the semiconductor memory is a DRAM chip, and the memory about the DRAM chip conforms to the DDR4 memory specification.

In some embodiments, the semiconductor memory is a DRAM chip, and the memory about the DRAM chip conforms to the DDR5 memory specification.

Methods disclosed in several method embodiments of the present disclosure can be combined with each other arbitrarily when they are not in conflict with each other, to obtain new method embodiments.

Features disclosed in several apparatus embodiments of the present disclosure can be combined with each other arbitrarily when they are not in conflict with each other, to obtain new apparatus embodiments.

It should be understood that in some examples, the terms "module" or "unit" in the present disclosure may be implemented one or more hardware circuits/sub-circuits and/or one or more processors. In some examples, a module or unit may include one or more circuits with or without stored code or instructions. The module or unit may include one or more components that are directly or indirectly connected. These components may or may not be physically attached to, or located adjacent to, one another.

The foregoing descriptions are merely specific implementations of the present disclosure, but are not intended to limit the protection scope of the present disclosure. Any variation or replacement readily conceived by those skilled in the art within the technical scope disclosed in the present disclosure shall fall within the protection scope of the present disclosure. Therefore, the protection scope of the present disclosure shall be subject to the protection scope of the claims.

INDUSTRIAL APPLICABILITY

In the present disclosure, voltage adjustment is performed on the low-level memory cells and the high-level memory cells, to increase potential differences between the low-level memory cells and the high-level memory cells, so as to intensify a potential current leakage defect between the memory cells. Thus, the potential current leakage defect between the adjacent memory cells can be detected during current leakage detection.

What is claimed is:

1. A method for intensifying current leakage between adjacent memory cells, the method comprising:
   performing a write operation on a memory array, to form a column strip test pattern, wherein the column strip test pattern is formed by arranging low-level memory cells and high-level memory cells in columns, and N columns of high-level memory cells are present between two adjacent columns of low-level memory cells, N≥2; and
   performing voltage adjustment on the low-level memory cells and the high-level memory cells, to increase potential differences between the low-level memory cells and the high-level memory cells.

2. The method according to claim 1, wherein performing voltage adjustment on the high-level memory cells comprises:
   connecting a high-level voltage VARY corresponding to the high-level memory cells to a high voltage VDD, to increase voltage levels of the high-level memory cells.

3. The method according to claim 1, further comprising:
   performing a plurality of refresh operations on the high-level memory cells.

4. The method according to claim 3, wherein performing voltage adjustment on the low-level memory cells and the high-level memory cells further comprises:
   adjusting plate voltages VPLT corresponding to the low-level memory cells and the high-level memory cells by a first stride after each refresh operation, until the plate voltages VPLT decreases to a target voltage.

5. The method according to claim 1, further comprising:
   performing voltage-decreasing adjustment on gate voltages VKK of the low-level memory cells and the high-level memory cells.

6. The method according to claim 1, further comprising:
   performing voltage-decreasing adjustment on bit line precharge voltages VBLP of the low-level memory cells and the high-level memory cells.

7. The method according to claim 1, wherein each low-level memory cell is a memory cell into which logic 0 is written, and each high-level memory cell is a memory cell into which logic 1 is written.

8. A method for current leakage detection based on the method according to claim 1, the method for current leakage detection comprising:
   performing a read operation on the low-level memory cells to read data; and
   obtaining current leakage detection results of the low-level memory cells based on the data.

9. The method according to claim 8, further comprising:
   restoring voltages corresponding to the low-level memory cells and the high-level memory cells after the current leakage detection results of the low-level memory cells are obtained.

10. An apparatus for intensifying current leakage between adjacent memory cells, the apparatus comprising:
    a writing circuit, configured to perform a write operation on a memory array, to form a column strip test pattern, wherein the column strip test pattern is formed by arranging low-level memory cells and high-level memory cells in columns, and N columns of high-level memory cells are present between two adjacent columns of low-level memory cells, N≥2; and
    a voltage adjustment circuit, configured to perform voltage adjustment on the low-level memory cells and the high-level memory cells, to increase potential differences between the low-level memory cells and the high-level memory cells.

11. The apparatus according to claim 10, wherein the voltage adjustment circuit is configured to connect a high-level voltage VARY corresponding to the high-level memory cells to a high voltage VDD, to increase levels of the high-level memory cells.

12. The apparatus according to claim 10, further comprising:
   a refresh circuit, configured to perform a plurality of refresh operations on the high-level memory cells.

13. The apparatus according to claim 12, wherein the voltage adjustment circuit is further configured to adjust plate voltages VPLT corresponding to the low-level memory cells and the high-level memory cells by a first stride after each refresh operation, until the plate voltages VPLT decreases to a target voltage.

14. The apparatus according to claim 10, further comprising:
   a first adjustment circuit, configured to perform voltage-decreasing adjustment on gate voltages VKK of the low-level memory cells and the high-level memory cells.

15. The apparatus according to claim 10, further comprising:
   a second adjustment circuit, configured to perform voltage-decreasing adjustment on bit line pre-charge voltages VBLP of the low-level memory cells and the high-level memory cells.

16. The apparatus according to claim 10, wherein each low-level memory cell is a memory cell into which logic 0 is written, and each high-level memory cell is a memory cell into which logic 1 is written.

17. An apparatus for current leakage detection comprising the apparatus according to claim 10, the apparatus for current leakage detection comprising:
   a reading circuit, configured to perform a read operation on the low-level memory cells to read data; and
   a processing circuit, configured to obtain current leakage detection results of the low-level memory cells based on the data.

18. The apparatus according to claim 17, further comprising:
   a restoring circuit, configured to restore voltages corresponding to the low-level memory cells and the high-level memory cells after the current leakage detection results of the low-level memory cells are obtained.

19. A semiconductor memory, comprising the apparatus according to claim 17.

20. The semiconductor memory according to claim 19, wherein the semiconductor memory is a dynamic random access memory (DRAM).

* * * * *